United States Patent
Solomko et al.

(10) Patent No.: US 9,608,305 B2
(45) Date of Patent: Mar. 28, 2017

(54) SYSTEM AND METHOD FOR A DIRECTIONAL COUPLER WITH A COMBINING CIRCUIT

(71) Applicant: Infineon Technologies AG, Neubiberg (DE)

(72) Inventors: Valentyn Solomko, Munich (DE); Winfried Bakalski, Munich (DE); Nikolay Ilkov, Munich (DE); Werner Simbuerger, Haar (DE); Daniel Kehrer, Sauerlach (DE)

(73) Assignee: Infineon Technologies AG, Neubiberg (DE)

( * ) Notice: Subject to any disclaimer, the term of this patent is extended or adjusted under 35 U.S.C. 154(b) by 350 days.

(21) Appl. No.: 14/155,130

(22) Filed: Jan. 14, 2014

(65) Prior Publication Data

US 2015/0200437 A1 Jul. 16, 2015

(51) Int. Cl.
*H01P 5/18* (2006.01)
*G01R 1/20* (2006.01)
(Continued)

(52) U.S. Cl.
CPC .......... *H01P 5/18* (2013.01); *G01R 1/203* (2013.01); *G01R 1/206* (2013.01); *G01R 19/00* (2013.01); *G01R 21/07* (2013.01); *H01P 5/04* (2013.01)

(58) Field of Classification Search
CPC ........ H03F 2200/465; H03F 2200/451; H03H 7/40; H03H 11/30; G06K 19/0717; G01N 29/036; G01N 33/0062; G01R 21/01; G01R 27/32; G01R 19/00; G01R 19/0007; G01R 19/25; G01R 19/2509; G01R 21/001; G01R 21/07; G01R 27/04; G01R 33/34092; G01R 33/36; G01R 33/3628; G01R 33/5659; G01R 33/583; G01R 35/005; G01R 1/203; G01R 1/206; G01R 25/00; G01R 25/005;
(Continued)

(56) References Cited

U.S. PATENT DOCUMENTS 4,434,397 A * 2/1984 Nelson .................. G01R 29/10
324/611
4,493,112 A * 1/1985 Bruene .................... H03H 7/40
333/17.3
(Continued)

FOREIGN PATENT DOCUMENTS

KR 20060057658 A 5/2006
KR 20120028176 A 3/2012

*Primary Examiner* — Vinh Nguyen
(74) *Attorney, Agent, or Firm* — Slater Matsil, LLP

(57) ABSTRACT

A circuit includes a current sensing circuit comprising a current input terminal coupled to an input port, a current output terminal coupled to a transmitted port, and a current sensing output terminal configured to provide a current sensing signal proportional to a current flowing between the current input terminal and the current output terminal. The circuit further includes a voltage sensing circuit having a voltage input terminal coupled to the transmitted port and a voltage sensing output terminal configured to provide a voltage sensing signal proportional to a voltage at the transmitted port. A combining circuit has a first input coupled to the current sensing output terminal, a second input coupled to the voltage sensing output terminal, and a combined output node coupled to an output port.

25 Claims, 7 Drawing Sheets

(51) Int. Cl.
*G01R 19/00* (2006.01)
*H01P 5/04* (2006.01)
*G01R 21/07* (2006.01)

(58) Field of Classification Search
CPC .... G01R 25/08; G01R 33/3456; G01R 33/54; G06F 15/00; H01P 5/04; H01P 5/18; H03B 5/1237; G01S 13/74; H04W 52/367
See application file for complete search history.

(56) References Cited

U.S. PATENT DOCUMENTS

| | | | |
|---|---|---|---|
| 4,795,886 A * | 1/1989 | Carter, Jr. | G05D 23/1906 219/494 |
| 6,728,224 B1 * | 4/2004 | Kakizaki | H04W 52/52 330/133 |
| 7,546,089 B2 * | 6/2009 | Bellantoni | H01P 5/04 333/101 |
| 2008/0186032 A1 * | 8/2008 | Van Bezooijen | G01R 27/04 324/646 |
| 2012/0001693 A1 | 1/2012 | Magoon et al. | |
| 2015/0002146 A1 | 1/2015 | Solomko et al. | |

* cited by examiner

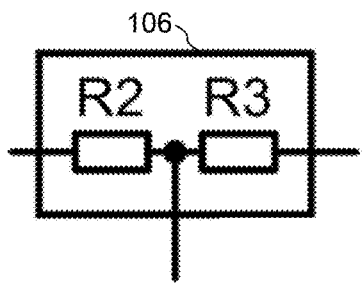
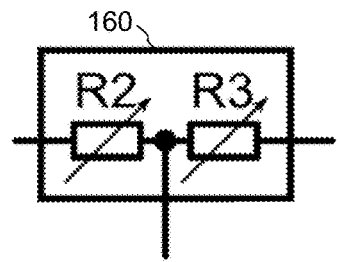
*FIG. 4a*  *FIG. 4b*
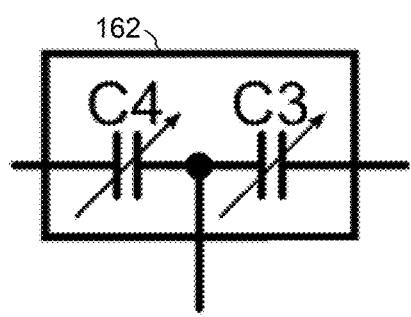
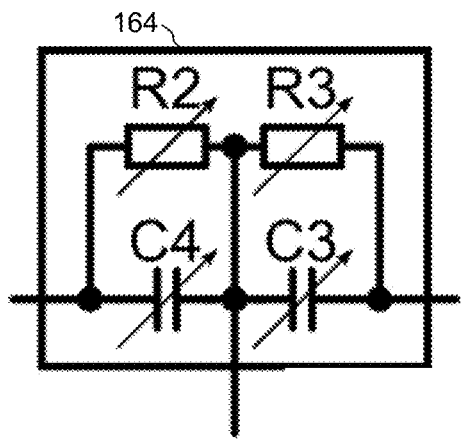
*FIG. 4c*  *FIG. 4d*
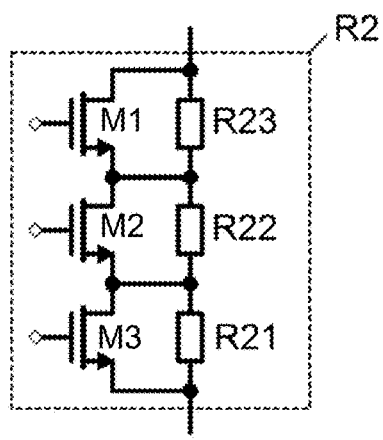
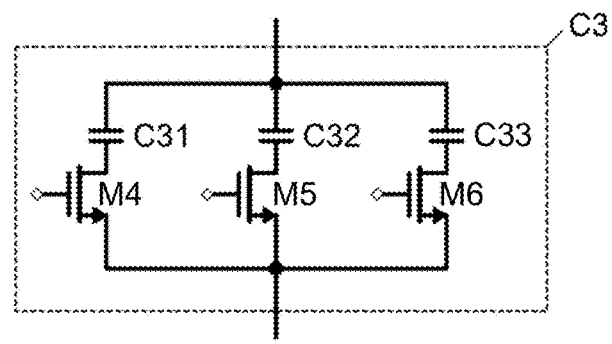
*FIG. 5a*  *FIG. 5b*

SYSTEM AND METHOD FOR A DIRECTIONAL COUPLER WITH A COMBINING CIRCUIT

TECHNICAL FIELD

The present disclosure relates generally to an electronic device, and more particularly to a system and method for a directional coupler.

BACKGROUND

Directional couplers, which are electronic devices that can detect power being transmitted in a particular direction, are used in a wide variety of radio frequency (RF) circuits. For example, a directional coupler may be used in a radar system to detect a reflected wave by separating the indecent wave from the reflected wave, or may be used in a circuit that measures the impedance mismatch of transmission lines. Functionally, a directional coupler has a forward transmission path and a coupled transmission path. The forward transmission path generally has a low loss, while the coupled transmission path couples a fraction of the transmission power that is propagated in a particular direction. There are many different types of coupler architectures that include electromagnetic couples and magnetic couplers. Each of these coupler types may be implemented using different topologies and materials depending on the frequency of operation and the operational environment.

For example, a directional coupler may be implemented using stripline structures disposed on a printed circuit board (PCB) or transformers. In some stripline implementations, various circuit elements may be as long as a quarter wavelength of the particular signal being measured. For applications that operate at frequencies between 500 MHz and 3.8 GHz, which covers the frequency range at which many cellular telephones operate, constructing stripline directional couplers on an integrated circuit becomes challenging dues to the wavelengths at these frequencies being much longer than the feature sizes on the integrated circuit. Low-loss magnetic-based directional couplers also are challenging to construct at this range of frequencies because of transformer losses and parasitics.

SUMMARY OF THE INVENTION

In accordance with an embodiment, a circuit includes a current sensing circuit comprising a current input terminal coupled to an input port, a current output terminal coupled to a transmitted port, and a current sensing output terminal configured to provide a current sensing signal proportional to a current flowing between the current input terminal and the current output terminal. The circuit further includes a voltage sensing circuit having a voltage input terminal coupled to the transmitted port and a voltage sensing output terminal configured to provide a voltage sensing signal proportional to a voltage at the transmitted port. A combining circuit has a first input coupled to the current sensing output terminal, a second input coupled to the voltage sensing output terminal, and a combined output node coupled to an output port.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4a-d illustrate embodiment tunable passive networks;

FIGS. 5a-b illustrate an embodiment tunable resistor and an embodiment tunable capacitor;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a directional coupler that may be used in RF circuits to measure incident or reflected power. Embodiments of the present invention may also be applied to other systems and applications including other circuits that utilize phase detectors such as phase-lock loop (PLL) circuits and power detectors. Moreover embodiment may be directed to systems that make RF measurements including, but not limited to devices that measure and/or tune impedance mismatch, time domain reflectometers (TDR), sensing devices for use with tunable antenna matching circuits, and tunable filters.

In an embodiment of the present invention, an impedance measurement device includes a voltage sensing network coupled to a current sensing network coupled in series with a transmission path of the impedance measurement device. The outputs of the voltage sensing network and the current sensing network are combined at an output port to produce a signal that is proportional to an incident signal propagated toward an input port, or alternatively toward a transmitted port of the impedance measurement device. The directivity of the impedance measurement device may be tuned by adjusting a phase and amplitude response of the voltage measurement device and/or by adjusting the relative amplitudes of the outputs of the voltage sensing network and the current sensing network used to form the combined signals. In some embodiments, this tuning may be performed automatically using a control circuit.

Figure 1A:
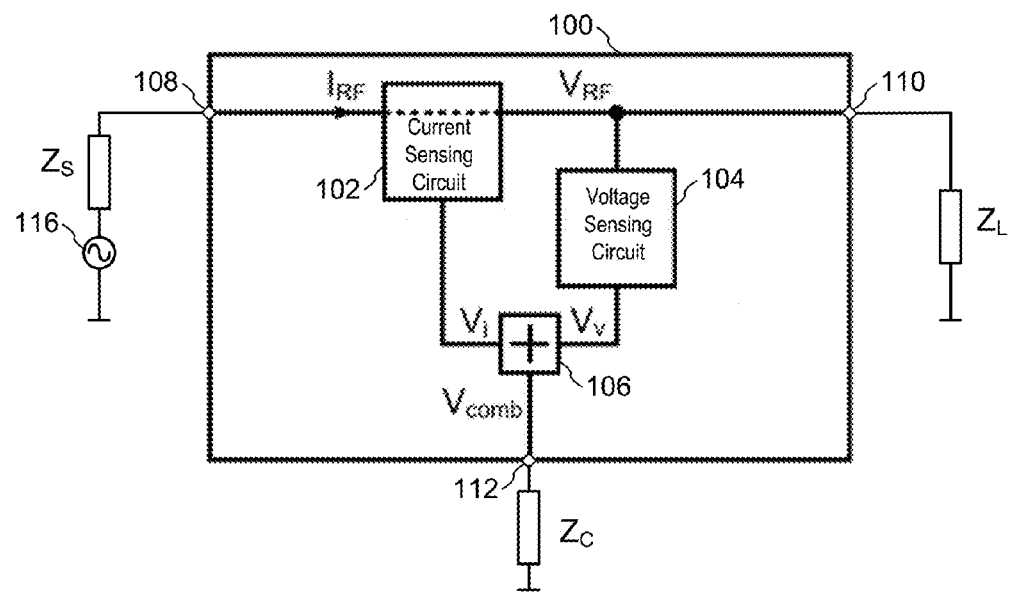
FIGS. 1a-c illustrate an embodiment directional coupler circuit and corresponding waveform diagrams.

FIG. 1a illustrates a directional coupler 100 according to an embodiment of the present invention, which includes input port 108, transmitted port 110, and output port 112. An RF signal passes through directional coupler 100 via input port 108 and transmitted port 110, and output port 112 couples a portion of the RF signal in either a forward direction or in a reverse direction. This RF signal is depicted as being generated by RF signal generator 116, however, it should be understood that the RF signal incident on input port 108 may be generated from various RF sources such as an amplifier or may be received, for example from an antenna. All ports are ideally terminated with reference impedance Z0, which is 50Ω in various embodiments. These termination impedances are shown as $Z_S$ coupled to input port 108, $Z_L$ coupled to transmitted port 110 and $Z_C$ coupled to output port 112. Alternatively, other characteristic impedances may be used for $Z_S$, $Z_L$, and $Z_C$ that may be the same or different from each other.

In various embodiments, directional coupler 100 includes current sensing circuit 102 that generates signal $V_i$, which is amplitude-scaled and phase shifted with respect to RF current $I_{RF}$. Directional coupler 100 further includes voltage sensing circuit 104 that generates a signal $V_v$ that is amplitude-scaled and phase shifted with respect to RF voltage $V_{RF}$, and combining circuit 106 that generates the signal proportional to the sum of $V_i$ and $V_v$. Signals Vi and Vv may exist, for example, as node voltages, voltages at output terminals, or as other signal types.

Figure 1B:
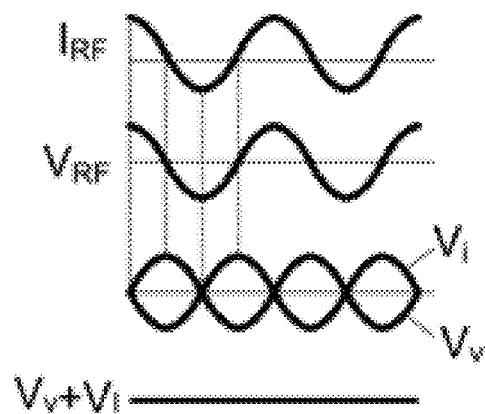
Figure 1C:
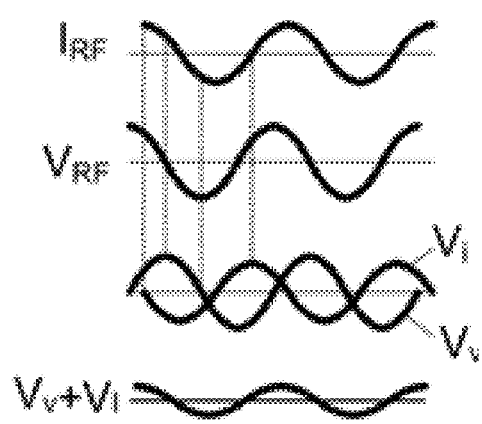

FIGS. 1b and 1c include waveform diagrams that illustrate the relationship between voltages $V_i$ and $V_v$ under matched impedance conditions and mismatched impedance conditions with respect to the circuit of FIG. 1a. FIG. 1b illustrates a waveform diagram showing the relationship between the input RF voltage/RF current and output voltages from the sensing and combining circuits of an embodiment coupler under matched impedance conditions. As shown, current $I_{RF}$ and voltage $V_{RF}$ are in-phase with each other with relative amplitudes that follow the following relationship:

$$\frac{V_{RF}}{I_{RF}} = Z_0.$$

Consequently, voltages $V_i$ and $V_v$ at the inputs of combining circuit 106 have equal amplitudes and are 180 degrees out of phase with each other such that the sum of $V_i$ and $V_v$ is zero and/or is a DC voltage. In some embodiments, the output of current sensing circuit 102 that produces Vi may be referred to as a current measurement node, and the output of voltage sensing circuit 104 that produces $V_v$ may be referred to as a voltage measurement node.

FIG. 1c illustrates a waveform diagram showing the relationship between the input RF voltage/RF current and output voltages from the sensing and combining circuits of an embodiment coupler under mismatched impedance conditions. As shown, current $I_{RF}$ and voltage $V_{RF}$ are out of phase with each other with relative amplitudes in which:

$$\frac{V_{RF}}{I_{RF}} \neq Z_0.$$

Under this condition, voltages $V_i$ and $V_v$ have unequal amplitudes and are not 180 degrees out of phase with each other. Therefore, the sum of $V_i$ and $V_v$ has an AC component. It should be understood that the sum of $V_i$ and $V_v$ may have an AC components in conditions in which $V_i$ and $V_v$ are in phase with each other but have unequal amplitudes, or under conditions in which $V_i$ and $V_v$ are out of phase with each other but have equal amplitudes. In alternative embodiments, the amplitudes and phases of $V_i$ and $V_v$ may be scaled such that unequal amplitude condition and/or an out of phase condition represents a matched impedance conditions.

Turning back to FIG. 1a, the AC response of voltage sensing circuit 104 may be described as $$V_v(j\omega) = C_v(j\omega) \cdot V_{RF}, \quad (1)$$

where $C_v(j\omega)$ represents the coupling factor of voltage sensing circuit 104; and the AC response of current sensing circuit 102 may be described as $$V_i(j\omega) = Z(j\omega) \cdot C_i(j\omega) \cdot I_{RF}, \quad (2)$$

where $C_i(j\omega)$ represents the coupling factor of current sensing circuit 102. Lastly, the AC response of combining circuit 106 may be described as $$V_{comb}(j\omega) = m_v(j\omega) \cdot V_v + m_i(j\omega) \cdot V_i, \quad (3)$$

where $m_v(j\omega)$ represents the signal gain and phase shift through combining circuit 106 as it affects $V_v$, and $m_i(j\omega)$ represents the signal gain and phase shift through combining circuit 106 as it affects $V_i$.

In an embodiment, $Z(j\omega)$ defines the impedance for which highest isolation is achieved. In an ideal coupler:

$$C_v(j\omega) = \pm C_i(j\omega), \text{ and} \quad (4)$$

$$Z(j\omega) = Z_0, \quad (5)$$

where $Z_0$ is a reference impedance, for example, 50Ω in some embodiments.

When $C_v(j\omega) = -C_i(j\omega)$ the signal at output port 112 indicates the amount of electromagnetic power propagating from transmitted port 110 to input port 108; at the same time the output port 112 is isolated from the electromagnetic power propagating from input port 108 to transmitted port 110. On the other hand, when $C_v(j\omega) = C_i(j\omega)$ the signal at output port 112 indicates the amount of electromagnetic power propagating from input port 108 to transmitted port 110; at the same time the output port 112 is isolated from the electromagnetic power propagating from transmitted port 110 to input port 108.

In an embodiment, current sensing circuit 102 and voltage sensing circuit 104 may be implemented using linear passive networks. Moreover, current sensing circuit 102, voltage sensing circuit 104 and combining circuit 106 may be tunable such that $C_v(j\omega)$, $C_i(j\omega)$, $m_v(j\omega)$ and $m_i(j\omega)$ are made electronically adjustable. For example, current sensing circuit 102, voltage sensing circuit 104 and combining circuit 106 may include passive networks that include switchable elements to provide adjustable AC transfer function.

Figure 2:
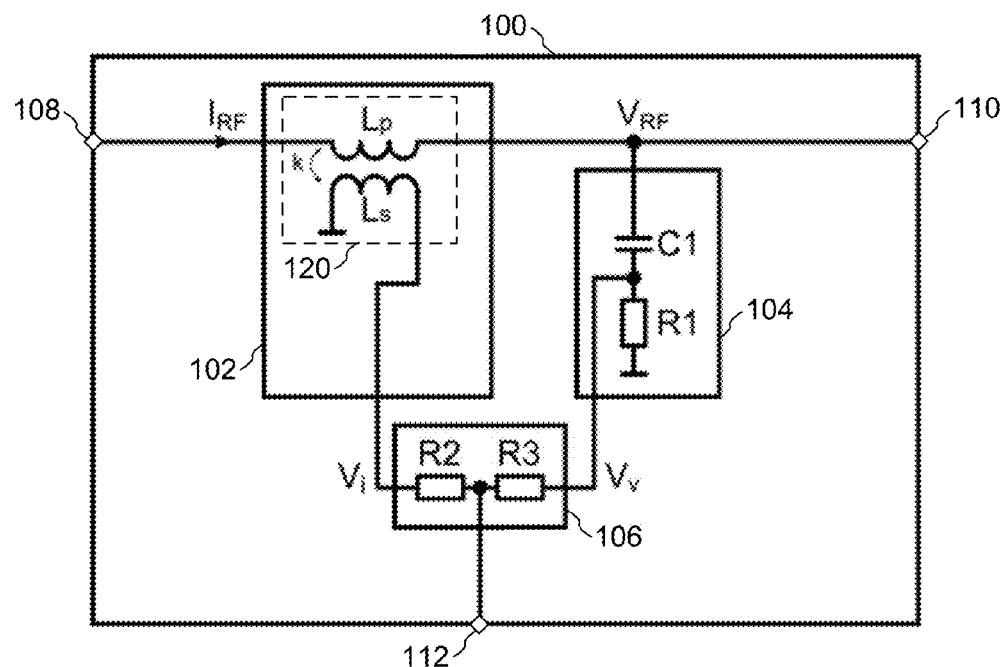
FIG. 2 illustrates another embodiment directional coupler circuit.

FIG. 2 illustrates an embodiment implementation of directional coupler 100 in which current sensing circuit 102 is implemented using magnetic transformer 120 having a primary winding represented by inductor Lp coupled between input port 108 and transmitted port 110, and a secondary winding represented by inductor Ls coupled between a reference node and a first input of a combining circuit. This reference node may be ground in some embodiments, or another reference node in other embodiments. Voltage sensing circuit 104 includes an RC network coupled between transmitted port 110 and the second input of combining circuit 106. Alternatively, voltage sensing circuit 104 may be coupled between input port 108 and the second input of combining circuit 106. The operation of magnetic transformer 120 in conjunction with the RC network of voltage sensing circuit 104 may proceed as described in co-pending U.S. patent application Ser. No. 13/931,092 entitled, "System and Method for a Transformer and a Phase-Shift Network" and filed on Jun. 28, 2013, which is incorporated by reference herein it its entirety. In some embodiments, combining circuit 106 includes two impedances that sum and scale the signals from the current sensing circuit 102 and the voltage sensing circuit 104. The two impedances in combining circuit 106 may be implemented, for example, as two resistors.

In the embodiment of FIG. 2, voltage $V_v$ may be expressed as:

$$V_v = \frac{j\omega R_1 C_1}{j\omega R_1 C_1 + 1} \cdot V_{RF}, \quad (6)$$

where $R_1$ is the resistance and $C_1$ is the capacitance of the RC network of voltage sensing circuit 104. When the cut-off frequency of the RC network is well above the operating frequency range of the coupler, namely $$\omega \ll \frac{1}{R_1 C_1}, \quad (7)$$

equation (6) may be approximated as follows:

$$V_v \approx j\omega R_1 C_1 \cdot V_{RF}. \quad (8)$$

Therefore, with respect to equation (1), voltage coupling factor $C_v(j\omega)$ of voltage sensing circuit 104 may be expressed as:

$$C_v(j\omega) = j\omega R_1 C_1. \quad (9)$$

Using the equation for an ideal transformer that is loaded with high impedance (assuming that R2 is much higher than the impedance seen at the secondary winding of the magnetic transformer), voltage $V_i$ may be expressed as:

$$V_i = -j\omega \cdot k \sqrt{L_p L_s} \cdot I_{RF}, \quad (10)$$

where $L_p$ and $L_s$ are the self-inductances of primary and secondary windings of transformer in the current sensing network, and k is a coupling factor between primary and secondary windings. In an embodiment, the various components and parameters k, $L_P$, $L_S$, $R_1$ and $C_1$ are chosen to meet the following condition:

$$\frac{k\sqrt{L_p L_s}}{R_1 C_1} = Z_0 \quad (11)$$

where $Z_0$ is a reference impedance.

Using equation (11) the equation (10) may be modified as $$V_i = -j\omega \cdot Z_0 \cdot R_1 C_1 \cdot I_{RF}. \quad (12)$$

Therefore, with respect to equation (2), current coupling factor $C_i(j\omega)$ of current sensing circuit 102 may be expressed as:

$$C_i(j\omega) = -j\omega R_1 C_1. \quad (13)$$

Figure 3:
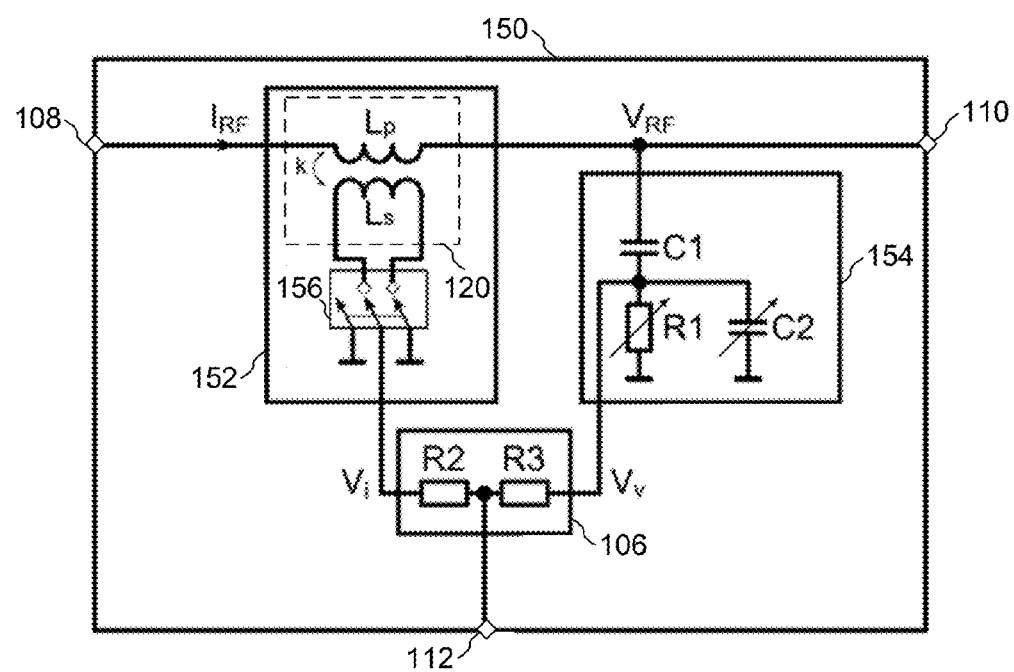
FIG. 3 illustrates a further embodiment coupler circuit.

FIG. 3 illustrates directional coupler 150 according to a further embodiment that is similar to the embodiment shown in FIG. 2, but further includes direction switch 156 coupled between magnetic transformer 120 and combining circuit 106. As shown, direction switch 156 is configured to reverse the polarity of the output of current sensing circuit 152 by selectively switching the output of current sensing circuit 152 to each end of the secondary winding of magnetic transformer 120, and selectively switching the reference node to the other end of the secondary winding of magnetic transformer 120. In some embodiments, direction switch 156 may be implemented using switching transistors. In addition, voltage sensing circuit 154 includes an RC network coupled between transmitted port 110 and the second input of the combining circuit. Alternatively, voltage sensing circuit 154 may be coupled between input port 108 and the second input of combining circuit 106. The RC network includes capacitor C1, tunable resistor R1 and tunable capacitor C2 used to implement a tunable transfer characteristic for voltage sensing circuit 154. The capacitor C1 may also be tunable.

The voltage sensing circuit of directional coupler 150 may be described as follows:

$$V_v = \frac{j\omega R_1 C_1}{j\omega R_1 (C_1 + C_2) + 1} \cdot V_{RF} \quad (14)$$

When $C_2$ is smaller than $C_1$, equation (14) may be approximated by (8). When C2>>C1, there is a phase shift between $V_v$ and $V_{RF}$ with the value between 0 and 90 degrees, depending on the capacitance of capacitor C2. By adjusting the capacitance of capacitor C2 and the resistance of resistor R1, the magnitude and phase of the transfer function of voltage sensing network may be tuned. Additionally, the magnitude and phase of the transfer function of voltage sensing circuit can be tuned by adjusting the capacitance of capacitor C1. It should be understood that the topology of voltage sensing circuit 154 is just one example of many possible embodiment voltage sensing circuits. In alternative embodiments, other networks that produce an adjustable phase shift may be used.

Direction switch 156 in current sensing circuit 152 changes the polarity of the voltage $V_i$, thereby implementing the following function:

$$V_i = -j\omega \cdot k \sqrt{L_p L_s} \cdot I_{RF} \text{ first position} \quad (15)$$

$$V_i = j\omega \cdot k \sqrt{L_p L_s} \cdot I_{RF} \text{ second position.} \quad (16)$$

As can be seen by equations (15) and (16), the selection switch inverts the output of current sensing circuit 152 by 180 degrees. When $V_i = j\omega \cdot k\sqrt{L_p L_s} \cdot I_{RF}$ the signal at output port 112 indicates the amount of electromagnetic power propagating from transmitted port 110 to input port 108; at the same time the output port 112 is isolated from the electromagnetic power propagating from input transmitted port 108 to transmitted port 110. When $V_i = -j\omega \cdot k\sqrt{L_p L_s} \cdot I_{RF}$, the signal at output port 112 indicates the amount of electromagnetic power propagating from input port 108 to transmitted port 110; at the same time the output port 112 is isolated from the electromagnetic power propagating from transmitted port 110 to input port 108.

FIGS. 4a-d illustrate various circuits that may be used to implement combining circuit 106. FIG. 4a illustrates combining circuit 106 that includes fixed resistors R2 and R3 that may be used in embodiments in which only a fixed ratio is needed between the outputs of current sensing circuit 102 and voltage sensing circuit 104. FIG. 4b illustrates combining circuit 160 in which resistor R2 and/or resistor R3 is tuneable. In FIG. 4c, combining circuit 162 is implemented using two tuneable capacitors C3 and C4, and in FIG. 4d, combining circuit 164 is implemented using tuneable resistors R2 and R3 coupled in parallel with capacitors C4 and C3, respectively. By independently adjusting resistors R2 and R3 and capacitors C4 and C3, both the amplitude and phase of $m_v(j\omega)$ and $m_i(j\omega)$ may be adjusted.

FIGS. 5a-b illustrate examples of tuneable passive elements that may be used to implement tuneable components in embodiment voltage sensing circuits and combining circuits. FIG. 5a illustrates an embodiment tuneable resistor that includes resistors R21, R22 and R23 coupled in series. NMOS transistors M1, M2 and M3 are used to selectively short out resistors R21, R22 and R23, respectively. In one example, a resistance of the sum of R21, R22 and R23 may be selected by turning off NMOS transistors M1, M2 and M3. In another example, a resistance of about R23 may be selected by turning on transistors M2 and M3 and turning off transistor M1. In alternative embodiments, greater or fewer than three switching transistors may be used to select greater or fewer than three resistors. In other embodiments, resistors may be selectable as combination or parallel resistors and/or a combination of both parallel and series resistors. Moreover, switching transistors M1, M2 and M3 may be implemented using other types of transistors besides NMOS transistors, for example, PMOS transistors, bipolar junction transistors and other types of transistors.

FIG. 5b illustrates an embodiment tuneable capacitor implemented by a parallel combination of selectable capacitors C31, C32 and C33 that are selected by NMOS transistors M4, M5 and M6. In alternative embodiments, greater or fewer than three switching transistors may be used to select greater or fewer than three capacitors. In other embodiments, capacitors may be selectable as combination or parallel capacitors and/or a combination of both parallel and series capacitors. Moreover, switching transistors M4, M5 and M6 may be implemented using other types of transistors besides NMOS transistors, for example, PMOS transistors, bipolar junction transistors and other types of transistors.

Figure 6:
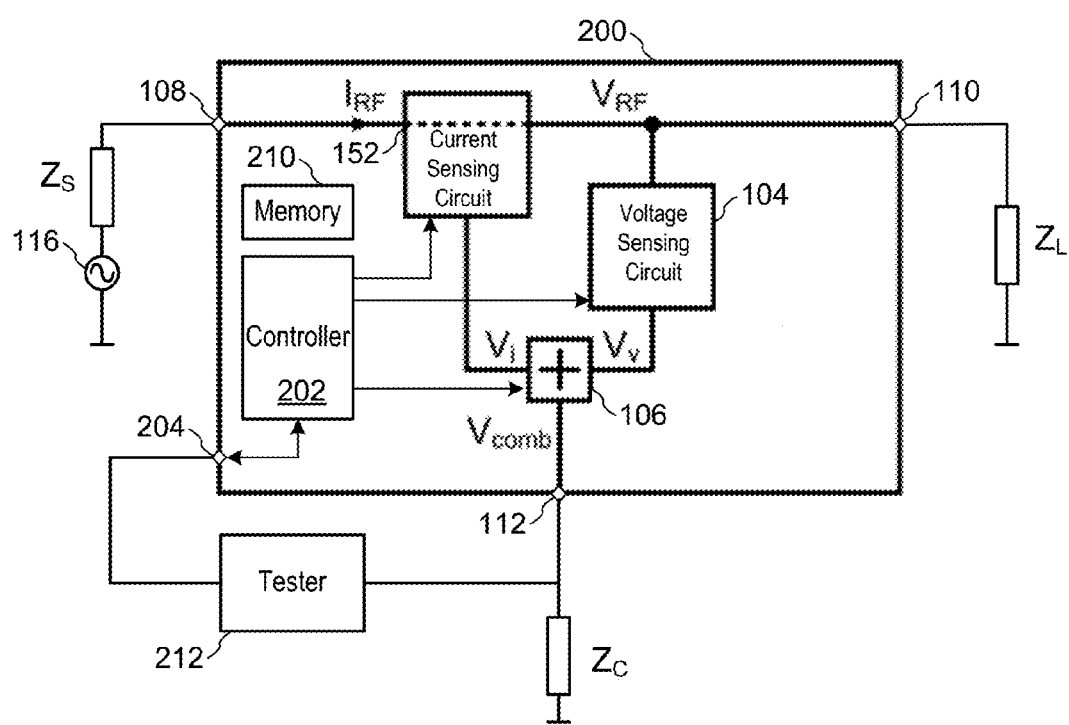
FIG. 6 illustrates an embodiment directional coupler system.

FIG. 6 illustrates embodiment directional coupler 200 that further includes controller 202 that may be used to tune and/or calibrate current sensing circuit 152, voltage sensing circuit 104 and combining circuit 106 via digital interface 204. As shown, controller 202 may be used to control settings within combining circuit 106 and voltage sensing circuit 104 by adjusting, for example, passive components within these blocks as described above. Controller 202 may be further coupled to current sensing circuit 152 to control the direction switch. In some embodiments, all of the elements in directional coupler 200 may be implemented on one or more integrated circuits. Controller 202 may be implemented using a microcontroller, a microprocessor, a state-machine, or other type of hard-wired or programmable logic. In further embodiments, controller 202 may include built-in self-test circuitry that provides some degree of control over the test and calibration sequence. The determined setting may be stored in memory 210, which may be implemented using a non-volatile memory such as an EEPROM, mask programmable ROM, programmable fuses or other type of memory. During testing, directional coupler 200 may operate under the control of tester 212 having an input coupled to transmitted port 110. Tester 212 may control the state of components such as a direction switch within current sensing circuit 152 and adjustable passive networks within voltage sensing circuit 104 and combining circuit 106.

Figure 7:
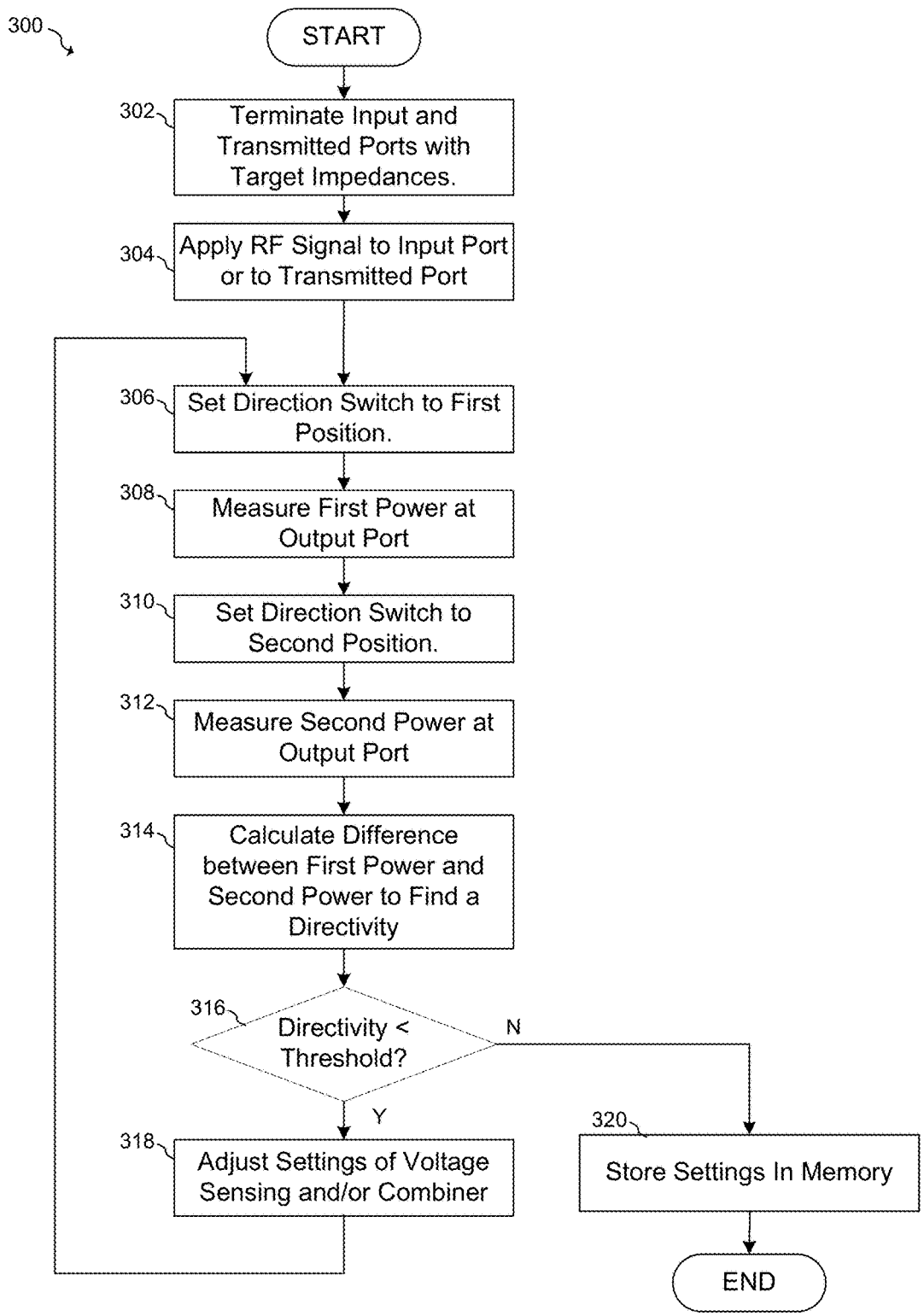
FIG. 7 illustrates a flowchart of an embodiment method.

FIG. 7 illustrates a flowchart of embodiment directional coupler calibration method 300. In an embodiment, the input port and the transmitted port are terminated with known impedances in step 302. In some embodiments, the output port is also terminated with a known impedance. In some cases, these impedances may all be terminated to a set characteristic impedance, such as $Z_0=50\Omega$. Alternatively, other impedances may be used. For example, in some embodiments, impedances coupled to the input port, transmitted port and/or output port may be deliberately mismatches in order to allow the calibration sequence to calibrate non-ideal system loads that may arise due to parasitic board impedances.

Next, in step 304, an RF signal is applied to the input port and/or to the transmitted port. This signal may be applied, for example, using an RF signal generator. In step 306, the direction switch, such as direction switch 156 shown in FIG. 3, is set to a first position such that the output of an embodiment current sensing circuit provides a signal of a first polarity. Next, in step 308, a first power is measured at the output port of the directional coupler. The direction switch is then set to a second position to invert the polarity of the output of the current sensing circuit in step 310, and then a second power is measured at the output port in step 312. A directivity is then calculated in step 314 by calculating a difference and/or a ratio between the first power and the second power.

The calculated directivity is then compared to a predetermined threshold in step 316. In some embodiments, this predetermined threshold may be, for example, between about 20 dB and about 25 dB for frequencies between about 500 MHz and about 3 GHz. Alternatively, other thresholds and frequencies outside of this range may be used depending on the particular application and its specifications. If the directivity is smaller than the predetermined threshold, the setting of the voltage sensing circuit and/or the combiner are adjusted in step 318 and steps 306 to 316 are repeated. The setting may be adjusted using an optimization algorithm such as a least-mean squares (LMS) algorithm or other algorithm known in the art. If, on the other hand, the measured and computed directivity is within the predetermined threshold, the setting of the voltage sensing circuit and/or the current sensing circuit art stored in a memory, such as a non-volatile memory in step 320.

Figure 8A:
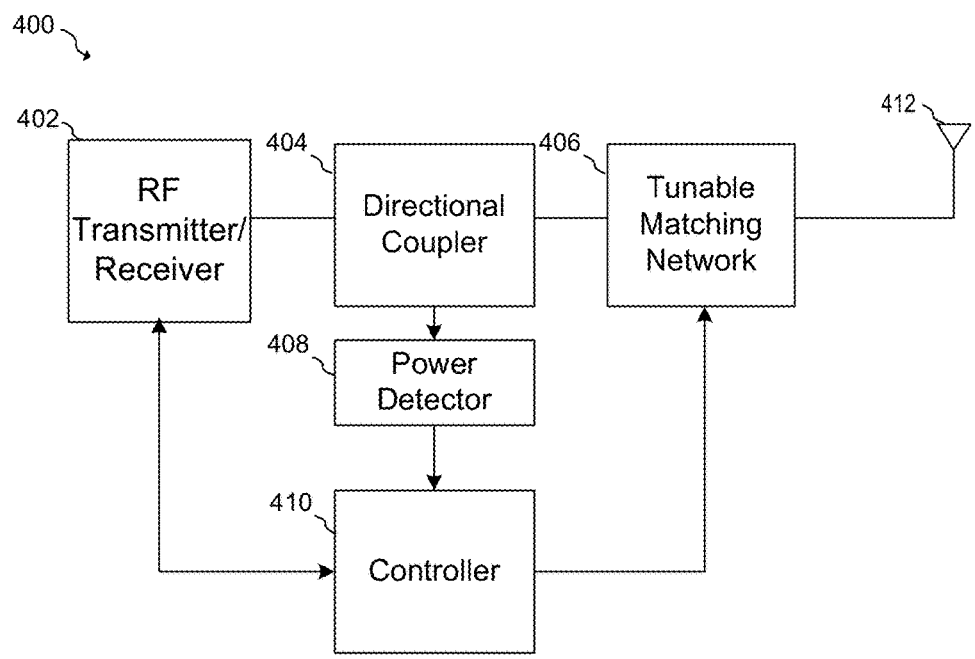
FIGS. 8a-d illustrate embodiment systems that utilize embodiment directional couplers.
Figure 8B:
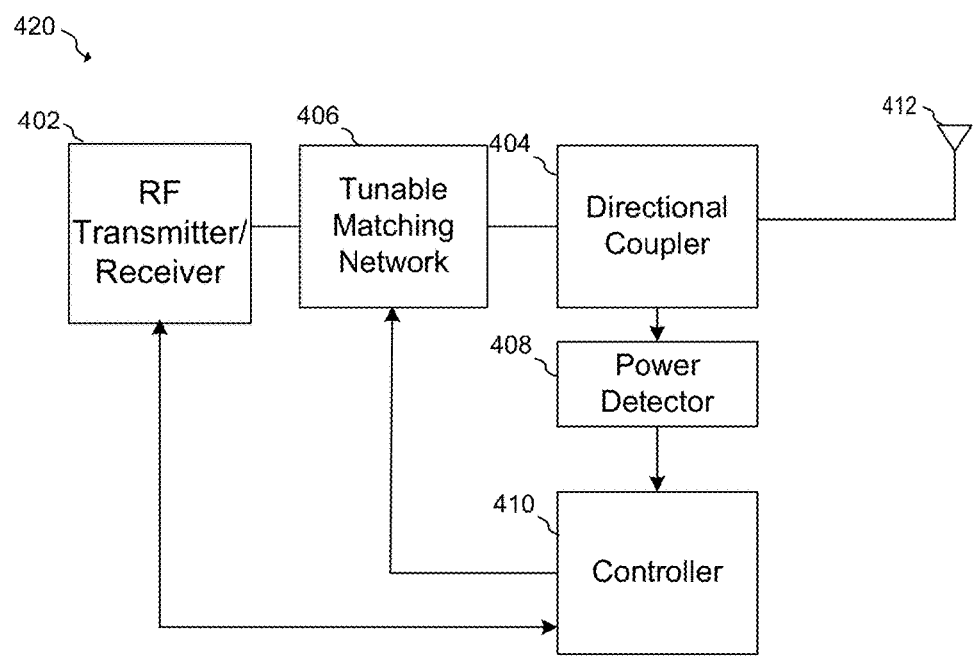

FIG. 8a illustrates RF system 400 according to an embodiment of the present invention. System 400 includes RF transceiver 402 coupled to antenna 412 via embodiment directional coupler 404 and tunable matching network 406. The output port of directional coupler 404 is coupled to power detector 408, the output of which is coupled to controller 410. In an embodiment, controller 410 adjusts tunable matching network 406 according to the digitized output of power detector 408. When directional coupler 404 detects an impedance mismatch between the RF transceiver 402 and the input to tunable matching network 406, controller 410 adjusts tunable matching network 406 until the measured its mismatch in impedance falls below a predetermined threshold in some embodiments. In some embodiments, controller 410 may be implemented, for example, using a processor, microcontroller, or dedicated system logic. RF system 400 may be implemented, for example, in the front end of a cellular telephone, wireless local area network transceiver, or other radio frequency system. In some embodiments, tunable matching network 406 is coupled between RF transceiver 402 and directional coupler 404, as shown in FIG. 8b with respect to system 420.

Figure 8C:
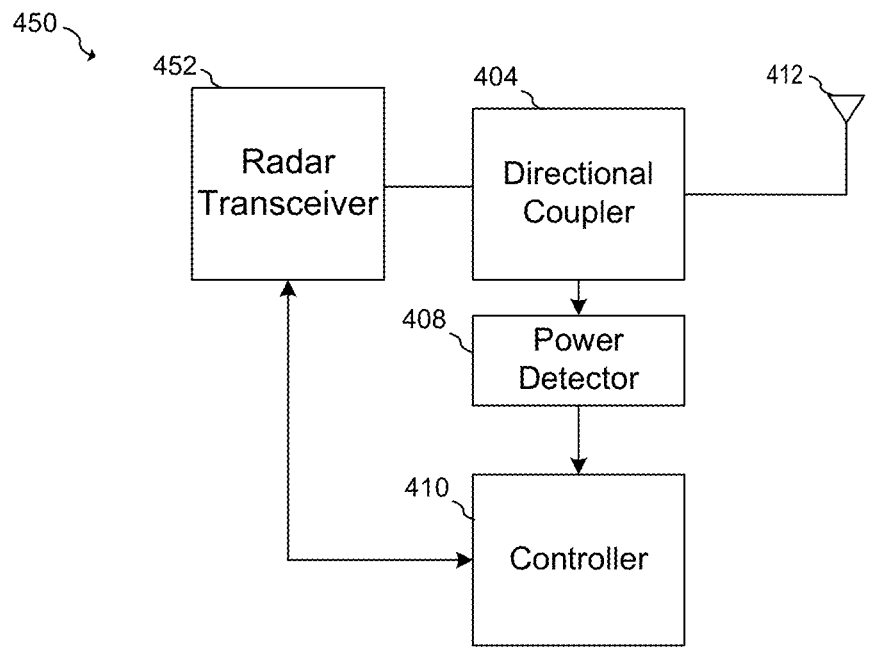

FIG. 8c illustrates embodiment radar system 450 according to another embodiment of the present invention. System 450 includes radar transceiver 452 coupled to antenna 412 via embodiment directional coupler 404. The output of directional coupler 604 is coupled to the controller 410 via power detector 408. In an embodiment, directional coupler 404 measures an incident signal from antenna 412 that may represent a reflected radar pulse. System 450 may be used, for example, a radar system such as automotive or proximity radar systems. Directional coupler 404 may be implemented, for example, using embodiment directional couplers disclosed herein. Other example systems that may utilize embodiment reflection measurement circuits include power monitoring in planar inverted F antenna (PIFA) feed-point tuners.

Figure 8D:
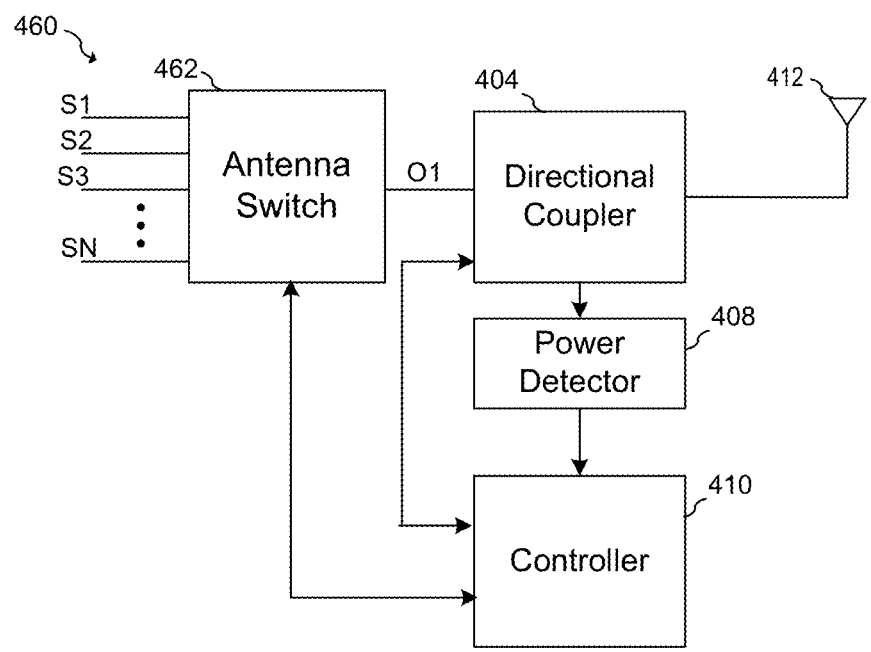

FIG. 8d illustrates embodiment system 460 that includes antenna switch 462 coupled to antenna 412 via embodiment directional coupler 404. Antenna switch 462 is configured to select and couple one input from among inputs S1 through SN to output node O1. The output port of directional coupler 404 is coupled to controller 410 via power detector 408. System 460 may be used, for example, to measure transmitted and reflected power in the forward and reverse direction by selecting a position of the polarity switch within directional coupler 404. The output of directional coupler 404 may be further used to perform envelope tracking and antenna tuning.

It should be appreciated that the embodiment shown in FIGS. 8a-d are just three examples of the many embodiment systems that may be implemented using embodiment directional couplers.

In accordance with an embodiment, a circuit includes a current sensing circuit having a current input terminal coupled to an input port, a current output terminal coupled to a transmitted port, and a current sensing output terminal configured to provide a current sensing signal proportional to a current flowing between the current input terminal and the current output terminal. The circuit further includes a voltage sensing circuit having a voltage input terminal coupled to the transmitted port and a voltage sensing output terminal configured to provide a voltage sensing signal proportional to a voltage at the transmitted port. A combining circuit has a first input coupled to the current sensing output terminal, a second input coupled to the voltage sensing output terminal, and a combined output node coupled to an output port. The circuit is configured to indicate an amount of electromagnetic power propagating between the input port and the transmitted port based on an amplitude difference and a phase difference between the voltage sensing output terminal and the current sensing output terminal.

In an embodiment, the circuit further includes a magnetic transformer having a first winding coupled between the current input terminal and the current output terminal, and a second winding coupled between a first reference node and the current sensing output terminal. The circuit may further include a switch coupled between the current sensing output terminal and the second winding. The switch may be configured to select a polarity by which the current sensing output terminal is coupled to the second winding.

In some embodiments, the voltage sensing circuit includes an adjustable network with an adjustable phase and amplitude response. The adjustable network may include a series capacitor coupled between the voltage input terminal and the voltage sensing output terminal, and a shunt resistor coupled between the voltage sensing output terminal and a reference node, such that at least one of the series capacitor and the shunt resistor is adjustable. In another embodiment, the adjustable network includes a series capacitor coupled between the voltage input terminal and the voltage sensing output terminal, a shunt resistor coupled between the voltage sensing output terminal and a reference node, and a shunt capacitor coupled between the voltage sensing output terminal and a reference node, such that at least one of the series capacitor, the shunt resistor and the shunt capacitor is adjustable.

The circuit may further include a controller configured to calibrate the adjustable network to produce a substantially 90° phase shift. In some embodiments, the circuit includes a controller configured to calibrate the adjustable network to substantially maximize a directivity of the circuit. In an embodiment, the combining circuit includes a further adjustable passive network, and the controller is further configured to calibrate the further adjustable passive network to substantially maximize the directivity of the circuit.

In some embodiments, the combining circuit includes a first impedance coupled between the current sensing output terminal and the combined output node, and a second impedance coupled between the voltage sensing output terminal and the combined output node. The first impedance may be implemented using a first resistor, and the second impedance may be implemented using a second resistor. Alternatively, the first and second impedances may be implemented using a first and second capacitor. In some embodiments, the first impedance may include a first adjustable impedance, and the second impedance may include a second adjustable impedance. For example, the first adjustable impedance may be implemented using a first adjustable resistor, and the second adjustable impedance may be implemented using a second adjustable resistor. In other embodiments, the first adjustable impedance may be implemented using a first adjustable capacitor, and the second adjustable impedance may be implemented using a second adjustable capacitor.

In accordance with a further embodiment, a directional coupler includes a magnetic transformer having a first winding coupled between an input port and a transmitted port, and a second winding coupled to a current sensing node and a reference node via a selectable polarity switch. The directional coupler also includes an adjustable passive network coupled between the transmitted port and a voltage sensing node, and a combining circuit having a first input coupled to the current sensing node, a second input coupled to the voltage sensing node, and an output coupled to an output port of the directional coupler.

In an embodiment, the input port is configured to be coupled to an RF signal source, the transmitted port is configured to be coupled to a first RF load, and the output port is configured to be coupled to a second RF load. The directional coupler may further include a controller configured to calibrate a directivity of the coupler by adjusting the adjustable passive network. This controller may be configured to calibrate the directivity by (a) setting the selectable polarity switch to a first position and measuring a first power at the output port; (b) setting the selectable polarity switch to a second position and measuring a second power at the output port; (c) calculating a difference between the first power and the second power; and (d) if the difference is smaller than a predetermined threshold, adjusting the adjustable passive network. In some embodiments, the controller is further configured to repeat steps (a), (b), (c) and (d) when the difference is smaller than the predetermined threshold. The controller may be further configured to store a setting for the adjustable passive network when the difference is greater than the predetermined threshold.

In an embodiment, the combining circuit includes an adjustable combining circuit; and the controller is further configured to adjust the adjustable combining circuit if the difference is greater than the predetermined threshold.

In accordance with a further embodiment, a method of calibrating a directional coupler includes measuring a directivity of the directional coupler to form a first measurement, adjusting a characteristic of a voltage sensing circuit to increase the directivity of the directional coupler when the first measurement is below a predetermined threshold, and repeating the measuring and the adjusting until the first measurement is above the predetermined threshold. The directional coupler itself includes a current sensing circuit coupled between an input port and a transmitted port, a voltage sensing circuit coupled between the transmitted port and a voltage sensing output terminal and a combining circuit having inputs coupled to the voltage sensing output terminal of the voltage sensing circuit and a current sensing output terminal of the current sensing circuit and an output coupled to an output port of the directional coupler.

In an embodiment, the method further includes adjusting the characteristic of the voltage sensing circuit comprises adjusting a passive network. In some embodiments, the combining circuit includes an adjustable combining circuit and the method further includes adjusting the adjustable combining circuit to increase the directivity of the directional coupler when the first measurement is below the predetermined threshold. Adjusting the adjustable combining circuit may include switching elements of a first tunable impedance coupled between the current sensing output terminal and the output port, and switching elements of a second tunable impedance coupled between the voltage sensing output terminal and the output port.

The method may further include terminating the input port with a first impedance and terminating the transmitted port with a second impedance. In various embodiments, measuring the directivity includes setting a direction switch to a first position, such that the direction switch is configured to select a polarity of the current sensing output terminal of the current sensing circuit. Measuring the directivity may further include applying a first RF signal at the input port, measuring a first power at the output port when the direction switch is in the first position, setting the direction switch to a second position, measuring a second power at the output port when the direction switch is in the second position, and calculating a difference between the first power and the second power to form the measured directivity.

Adjusting the characteristic of the voltage sensing circuit may include applying settings for tunable elements to the voltage sensing circuit. In some embodiments, the method further includes storing the setting for the tunable elements in a non-volatile memory after the first measurement is above the predetermined threshold.

Advantages of some embodiment directional couplers include the ability to monitor the power of an RF signal in both the forward and reverse direction using only a single coupled output port. Another advantage includes the ability to calibrate the directivity of a directional coupler to compensate for component and process variations, as well as variations and non-idealities due to on-board parasitic impedances. As such, embodiment directional couplers may achieve high directivity using standard semiconductor processes and/or inexpensive components.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A circuit comprising:
    a current sensing circuit comprising a current input terminal coupled to an input port, a current output terminal coupled to a transmitted port, and a current sensing output terminal configured to provide a current sensing signal proportional to a current flowing between the current input terminal and the current output terminal;
    a voltage sensing circuit having a voltage input terminal coupled to the transmitted port and a voltage sensing output terminal configured to provide a voltage sensing signal proportional to a voltage at the transmitted port; and
    a combining circuit having a first input coupled to the current sensing output terminal, a second input coupled to the voltage sensing output terminal, and a combined output node coupled to an output port, wherein
        the combining circuit is configured to provide a first signal proportional to a sum of the current sensing signal and the voltage sensing signal, and
        the first signal indicates an amount of electromagnetic power propagating between the input port and the transmitted port based on an amplitude difference and a phase difference between the voltage sensing output terminal and the current sensing output terminal.

2. The circuit of claim 1, wherein the current sensing circuit comprises a magnetic transformer having a first winding coupled between the current input terminal and the current output terminal, and a second winding coupled between a first reference node and the current sensing output terminal.

3. The circuit of claim 2, further comprising a switch coupled between the current sensing output terminal and the second winding.

4. The circuit of claim 3, wherein the switch is configured to select a polarity by which the current sensing output terminal is coupled to the second winding.

5. The circuit of claim 1, wherein the voltage sensing circuit comprises an adjustable network with an adjustable phase and amplitude response.

6. The circuit of claim 5, wherein the adjustable network comprises:
    a series capacitor coupled between the voltage input terminal and the voltage sensing output terminal; and
    a shunt resistor coupled between the voltage sensing output terminal and a reference node, wherein at least one of the series capacitor and the shunt resistor is adjustable.

7. The circuit of claim 5, wherein the adjustable network comprises:
    a series capacitor coupled between the voltage input terminal and the voltage sensing output terminal;
    a shunt resistor coupled between the voltage sensing output terminal and a reference node; and
    a shunt capacitor coupled between the voltage sensing output terminal and a reference node, wherein at least one of the series capacitor, the shunt resistor and the shunt capacitor is adjustable.

8. The circuit of claim 7, further comprising a controller configured to calibrate the adjustable network to produce a substantially 90° phase shift, wherein the controller, the voltage sensing circuit, the current sensing circuit and the combining circuit are disposed on a single integrated circuit.

9. The circuit of claim 7, wherein:
the voltage sensing circuit, the current sensing circuit and the combining circuit are disposed on a first single integrated circuit; and
the adjustable network of the voltage sensing circuit is configured to be coupled to a controller on a second integrated circuit separate from the first single integrated circuit.

10. The circuit of claim 5, further comprising a controller configured to calibrate the adjustable network to produce a substantially 90° phase shift.

11. The circuit of claim 5, further comprising a controller configured to calibrate the adjustable network to substantially maximize a directivity of the circuit.

12. The circuit of claim 11, wherein:
the combining circuit comprises a further adjustable passive network; and
the controller is further configured to calibrate the further adjustable passive network to substantially maximize the directivity of the circuit.

13. The circuit of claim 1, wherein the combining circuit comprises;
a first impedance coupled between the current sensing output terminal and the combined output node; and
a second impedance coupled between the voltage sensing output terminal and the combined output node.

14. The circuit of claim 13, wherein:
the first impedance is a first resistor; and
the second impedance a second resistor.

15. The circuit of claim 13, wherein:
the first impedance is a first capacitor; and
the second impedance a second capacitor.

16. The circuit of claim 13, wherein:
the first impedance comprises a first adjustable impedance; and
the second impedance comprises a second adjustable impedance.

17. The circuit of claim 16, wherein:
the first adjustable impedance is a first adjustable resistor; and
the second adjustable impedance a second adjustable resistor.

18. The circuit of claim 16, wherein:
the first adjustable impedance is a first adjustable capacitor; and
the second adjustable impedance a second adjustable capacitor.

19. A directional coupler comprising:
a magnetic transformer having a first winding coupled between an input port and a transmitted port, and a second winding coupled to a current sensing node and a reference node via a selectable polarity switch;
an adjustable passive network coupled between the transmitted port and a voltage sensing node; and
a combining circuit having a first input coupled to the current sensing node, a second input coupled to the voltage sensing node, and an output coupled to an output port of the directional coupler.

20. The directional coupler of claim 19, wherein:
the input port is configured to be coupled to an RF signal source;
the transmitted port is configured to be coupled to a first RF load; and
the output port is configured to be coupled to a second RF load.

21. The directional coupler of claim 19, further comprising a controller configured to calibrate a directivity of the directional coupler by adjusting the adjustable passive network.

22. The directional coupler of claim 21, wherein the controller is configured to calibrate the directivity by:
a) setting the selectable polarity switch to a first position and measuring a first power at the output port;
b) setting the selectable polarity switch to a second position and measuring a second power at the output port;
c) calculating a difference between the first power and the second power; and
d) if the difference is smaller than a predetermined threshold, adjusting the adjustable passive network.

23. The directional coupler of claim 22, wherein the controller is further configured to store a setting for the adjustable passive network when the difference is greater than the predetermined threshold.

24. The directional coupler of claim 22, wherein the controller is further configured to repeat steps a), b), c) and d) when the difference is smaller than the predetermined threshold.

25. The directional coupler of claim 22, wherein
the combining circuit comprises an adjustable combining circuit; and
the controller is further configured to adjust the adjustable combining circuit if the difference is greater than the predetermined threshold.

* * * * *